United States Patent [19]

Cannon

[11] Patent Number: 5,332,144
[45] Date of Patent: Jul. 26, 1994

[54] CONCAVE SOLDERING IRON TIP AND METHOD OF SOLDERING USING SAME

[75] Inventor: Mark Cannon, Karlsruhe, Fed. Rep. of Germany

[73] Assignee: Pace, Incorporated, Laurel, Md.

[21] Appl. No.: 33,410

[22] Filed: Mar. 17, 1993

[51] Int. Cl.$^5$ .................... B23K 1/00; H05K 3/34
[52] U.S. Cl. ........................ 228/52; 228/54; 219/229
[58] Field of Search .......... 228/180.21, 51–55; 219/229, 230

[56] References Cited

U.S. PATENT DOCUMENTS

| | | | |
|---|---|---|---|
| 2,905,799 | 9/1959 | Rugeris | 228/53 |
| 3,003,049 | 10/1961 | Thomas | 228/53 |
| 3,315,350 | 4/1967 | Kent | 228/54 |
| 3,580,462 | 5/1971 | Vanyi | 228/53 |
| 4,648,545 | 3/1987 | Polckemann | 228/53 |
| 4,699,308 | 10/1987 | Wigley et al. | 228/53 |
| 4,936,501 | 6/1990 | Babarin | 228/53 |
| 5,127,572 | 7/1992 | Pazhouhesh et al. | 228/52 |

FOREIGN PATENT DOCUMENTS

| | | | |
|---|---|---|---|
| 63-084766 | 4/1988 | Japan | 228/52 |
| 63-137577 | 6/1988 | Japan | 228/52 |

OTHER PUBLICATIONS

Pace, Inc., *Tip Catalog for Sensatemp Systems*, 1992.

*Primary Examiner*—Samuel M. Heinrich
*Attorney, Agent, or Firm*—Sixbey, Friedman, Leedom & Ferguson

[57] ABSTRACT

In accordance with a preferred embodiment of the present invention, a concavity of an elliptical shape is formed in a chisel-shaped soldering tip to create a reservoir in which a quantity of molten solder is retained by surface tension. In a preferred method of use, the leads of an electronic component and the lands of a circuit board to which they are to be electrically connected are pretreated with flux. The tip, with a blob of solder in its concavity, is drawn along the lead/land region with the blob of molten solder making contact therewith, so that molten solder is wicked into the region, and joints are formed between the leads the lands.

8 Claims, 2 Drawing Sheets

CONCAVE SOLDERING IRON TIP AND METHOD OF SOLDERING USING SAME

BACKGROUND OF THE INVENTION

1. Field of the Invention

The present invention relates to methods of soldering electronic components using hand-held soldering irons, and tips for such soldering irons of the type having a chisel-type shape.

2. Description of Related Art

A wide variety of soldering tips of differing sizes and shapes are known for use with soldering irons; see, for example, *TIP CATALOG FOR SENSATEMP SYSTEMS*, PACE, Inc., Feb. 19, 1992. These tips, which are usually plated with iron, are usually tinned with solder for producing a soldered joint. However, these tips can hold only a limited amount of solder so that the solder will run out after only a few joints are formed, and solder will have to be reapplied to the tip. On the other hand, if too much solder is applied to the tip, it will drip off when the tip is positioned to solder. Furthermore, there is no way to control the amount of solder that will flow from the tip, so that, when more than a minimal quantity of solder is on the tip, there is a tendency for too much solder to be applied in a way that creates solder bridges between adjacent joints, and a solder connection between two separate joints forms a short.

Numerous instances of the use of hollow solder-containing tips are known in the art, as can be seen by reference to U.S. Pat. Nos. 2,905,799 to De Rugeris, 3,003,049 to Thomas, 3,580,462 to Vanyi, 4,648,545 Polckemann, 4,699,308 to Wigley et al., and 4,936,501 to Babarinier. However, for the most part, these devices are not well suited to use in soldering electrical components since the tips cannot be appropriately shaped and they, also, would be prone to the creation of solder bridges between adjacent connections. Still further, the solder-containing tips of the soldering irons are not designed as interchangeable tips that can be used with other, existing soldering irons as a replacement tip.

Thus, there is a need for a soldering tip which will have an increased solder-carrying capacity but which will not be prone to the formation of solder bridges between adjacent connections.

SUMMARY OF THE INVENTION

In view of the foregoing, it is a primary object of the present invention to provide a soldering tip with a recess that retains solder by surface tension.

It is a further object to provide a soldering tip having a concavity from which molten solder can be drawn by capillary(-like) action into a region between a lead and a land to thereby form a solder joint.

In accordance with a preferred embodiment of the present invention, these and other objects are achieved by the provision of a concavity of an elliptical shape in a chisel-shaped soldering tip. In a preferred method of use, the leads of an electronic component and the lands of a circuit board to which they are to be electrically connected, advantageously, may be pretreated with flux. The tip, with a quantity of molten solder in its concavity, is drawn along the lead/land region with the quantity of molten solder making contact therewith so that molten solder is wicked into the region and joints are formed between the leads and the lands.

These and further objects, features and advantages of the present invention will become apparent from the following description when taken in connection with the accompanying drawings which, for purposes of illustration only, show a single embodiment in accordance with the present invention.

DETAILED DESCRIPTION OF THE PREFERRED EMBODIMENT

Figure 1:
FIG. 1 is a plan view of a soldering tip in accordance with a preferred embodiment of the present invention.
Figure 3:
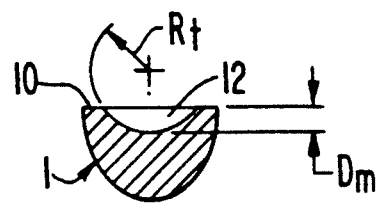
FIG. 3 is an enlarged cross-sectional view taken along line 3—3 in FIG. 2.
Figure 2:
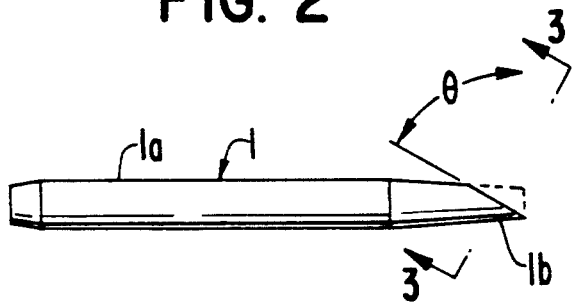
FIG. 2 is a side elevational view of the soldering tip of FIG. 1.
Figure 4:
FIG. 4 is an elevational view in the direction of an oblique end face of the soldering tip of FIG. 2, i.e., parallel to line 3—3.
Figure 5:
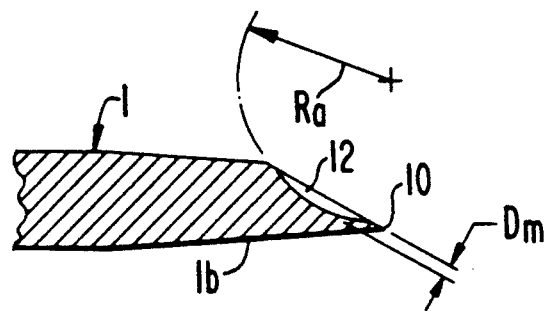
FIG. 5 is an enlarged cross-sectional view taken along line 5—5 in FIG. 4.
Figure 6:
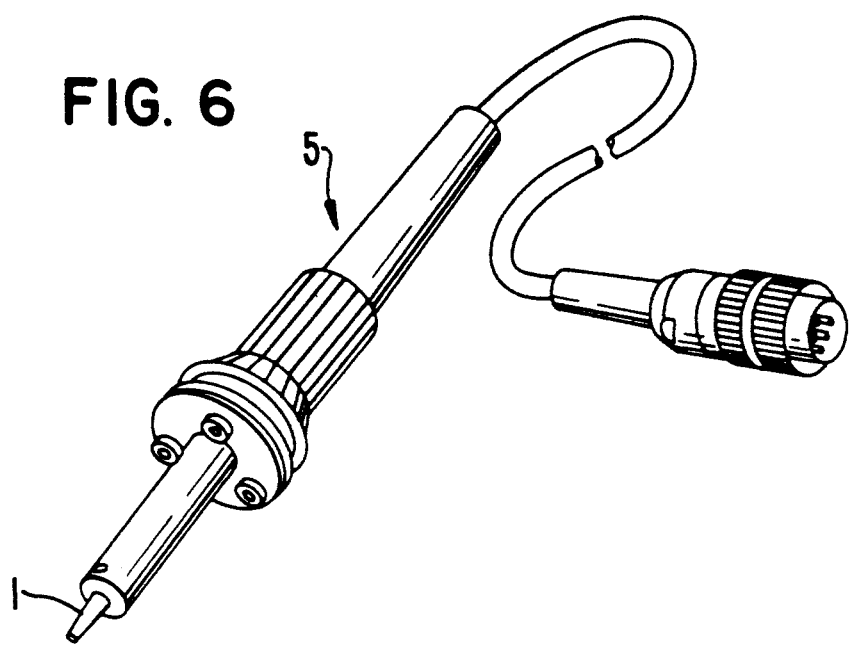
FIG. 6 is a perspective view of a hand-held soldering device with a soldering tip in accordance with the present invention.

FIGS. 1-5 illustrate a soldering tip 1 for a hand-held soldering device, such as the soldering iron 5 shown in FIG. 6. Tip 1 is formed of a rod of thermally conductive material, such as copper, that has been overplated with iron and then nickel with the shank portion 1a being then overplated with chrome and the tapered working end dipped in solder, as is conventional for soldering tips. Furthermore, the working end 1b is been machined to form an oblique surface 10, which forms, for example, an angle $\theta$ with respect to a line which is normal to the longitudinal axis of the tip 1, thereby giving the tip 1 a chisel shape.

In accordance with the invention, to increase the quantity of solder that can be held on the working end 1a by surface tension, a reservoir for holding a quantity of solder is produced by forming a concavity 12 in the oblique surface 10. This concavity 12 is, preferably elliptically-shaped to maximize the surface area to volume ratio. By way of example only, concavity 12 may have an axial radius of curvature $R_a$ of about 0.269" and a transverse radius of curvature $R_t$ of about 0.054" with a maximum depth $D_m$ of 0.020" when the oblique surface has a length of about 0.244" in a direction corresponding to the major axis of the elliptically-shaped concavity 12.

Figure 7:
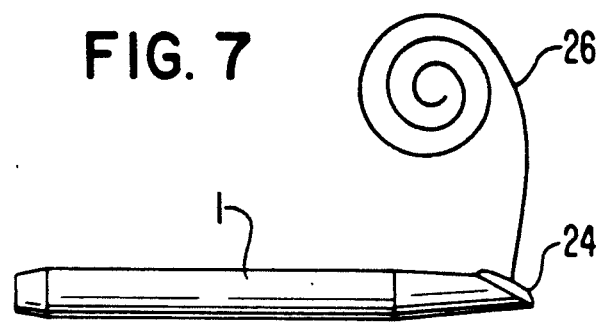
FIGS. 7&8 are views illustrating steps in the performance of the method of soldering in accordance with the present invention.
Figure 8:
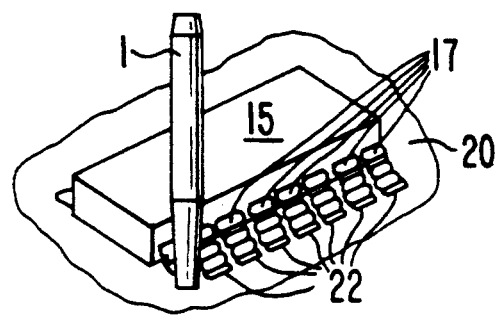

A tip 1, in accordance with the present invention, is especially advantageous for use in soldering leads of an electronic component 15 to lands on the surface of a substrate 20, and avoids the need to either feed solder wire onto a hot soldering iron tip, holding both on a joint to be soldered, or to apply solder onto the soldering tip prior to forming each joint. Instead, after positioning the leads 17 in contact with said lands 22 and pretreating the leads and lands (as would normally be done), the soldering tip 1 is heated by the soldering device (such as soldering iron 5) and a quantity of solder 24 is melted into concavity 12 (FIG. 7), where it is retained by surface tension. Then, by drawing the solder-containing tip along the region between the leads 17 and lands 22 with the quantity of molten solder on the tip 1 making contact with this region (as shown in FIG. 8), the molten solder on the soldering tip will be wicked into the region and solder joints formed between the leads and the lands. Further, the inventive tip 1 should be operated at lower temperatures than the tip of a conventional soldering iron, i.e., at a temperature of approximately 550° to 600° F. As a result, the operator need not be as skilled to produce proper electrical joints without solder bridges being formed between adjacent joints; the molten solder at this lower temperature has such viscosity characteristics as to maximize surface tension between the solder and the tip.

While I have shown and described only one preferred embodiment in accordance with the present invention, it is understood that the invention is not limited thereto, but is susceptible of numerous changes and modifications as known to those skilled in the art. For example, instead of using the soldering iron 5 shown, the tip 1 can be used in a wide variety of other types of hand-held soldering devices, such as soldering guns and other solder irons. Likewise, instead of being chisel-shaped, the working end of the tip may be blade-shaped and the size, shape and/or proportions of the concavity modified accordingly so as to maximize the quantity of solder which can be retained by surface tension, without dripping, even when the tip is in it working orientation (wherein the recess faces downwardly, as reflected by the broken line representation thereof in FIG. 8). Therefore, do not wish to be limited to the details shown and described herein, but intend to cover all such changes and modifications as are encompassed by the scope of the appended claims.

I claim:

1. A soldering tip for a hand-held soldering device, comprising a rod of thermally conductive material having an oblique surface formed at one end thereof, and a concavity formed in said oblique surface, wherein said concavity has an elliptical perimetric shape and an arcuate cross-sectional shape, and wherein said concavity forms a reservoir means for holding a quantity of solder therein by surface tension.

2. A soldering tip for a hand-held soldering iron according to claim 1, wherein the tip is generally chisel-shaped.

3. A soldering tip for a hand-held soldering iron according to claim 1, wherein the oblique surface forms a 30° angle with respect to a longitudinal axis of the rod.

4. A soldering tip for a hand-held soldering iron according to claim 1, wherein the rod is formed of solid copper alloy having an iron plating and a nickel plating over the iron plating.

5. In a hand-held soldering device of the type having a hand-holdable unit with an electrical heater therein and at least one soldering tip that is detachably attachable to the hand-holdable unit in heat transfer relationship to said electrical heater, the improvement for maximizing the quantity of solder holdable on said tip without dripping, comprising said soldering tip being formed of a rod of thermally conductive material having an oblique surface formed at one end thereof, and a concavity formed in said oblique surface, wherein said concavity has an elliptical perimetric shape and an arcuate cross-sectional shape, and wherein said concavity forms a reservoir means for holding a quantity of solder therein by surface tension.

6. A hand-held soldering device according to claim 5, wherein the tip is generally chisel-shaped.

7. A hand-held soldering device according to claim 5, wherein the oblique surface forms a 30° angle with respect to a longitudinal axis of the rod.

8. A soldering tip for a hand-held soldering iron according to claim 5, wherein the rod is formed of solid copper alloy having an iron plating and a nickel plating over the iron plating.

* * * * *